(12) United States Patent
Wu et al.

(10) Patent No.: US 9,038,262 B2
(45) Date of Patent: May 26, 2015

(54) DEVICE FOR HOLDING DISK-SHAPED ARTICLES AND METHOD THEREOF

(75) Inventors: Yi Wu, Beijing (CN); Hao Wang, Beijing (CN); Wei Li, Beijing (CN); Ruiting Wang, Beijing (CN); Bao Zhang, Beijing (CN)

(73) Assignee: BEIJING SEVENSTAR ELECTRONICS CO., LTD., Beijing (CN)

( * ) Notice: Subject to any disclaimer, the term of this patent is extended or adjusted under 35 U.S.C. 154(b) by 314 days.

(21) Appl. No.: 13/701,939

(22) PCT Filed: Jun. 13, 2012

(86) PCT No.: PCT/CN2012/076831
§ 371 (c)(1),
(2), (4) Date: Dec. 4, 2012

(87) PCT Pub. No.: WO2013/123742
PCT Pub. Date: Aug. 29, 2013

(65) Prior Publication Data
US 2013/0219693 A1 Aug. 29, 2013

(51) Int. Cl.
*H01L 21/687* (2006.01)
*B23Q 7/00* (2006.01)
*B23B 31/103* (2006.01)
*B23B 31/24* (2006.01)

(52) U.S. Cl.
CPC ........ *H01L 21/68728* (2013.01); *B23B 31/103* (2013.01); *B23B 31/24* (2013.01); *Y10T 279/18* (2015.01); *Y10T 279/12* (2015.01); *Y10T 29/49998* (2015.01)

(58) Field of Classification Search
CPC ................ H01L 21/6838; H01L 21/68728;
H01L 21/6831; H01L 21/6833; H01L 21/68721; H01L 21/68707; Y10S 414/141; Y10T 279/18; Y10T 279/19; Y10T 29/49998; B25J 15/0246; B25J 15/0608; B23B 31/101; B23B 31/1173; B23B 31/12; B23B 31/28
See application file for complete search history.

(56) References Cited

U.S. PATENT DOCUMENTS

| | | | | | |
|---|---|---|---|---|---|
| 4,788,994 | A | * | 12/1988 | Shinbara | 134/157 |
| 5,192,087 | A | * | 3/1993 | Kawashima et al. | 279/71 |
| 5,376,216 | A | * | 12/1994 | Yoshioka et al. | 156/345.55 |
| 5,421,056 | A | * | 6/1995 | Tateyama et al. | 15/302 |
| 5,762,391 | A | * | 6/1998 | Sumnitsch | 294/119.1 |
| 5,931,518 | A | * | 8/1999 | Pirker | 294/119.1 |
| 5,954,072 | A | * | 9/1999 | Matusita | 134/149 |

(Continued)

FOREIGN PATENT DOCUMENTS

WO WO 9716847 A1 * 5/1997 .......... H01L 21/6838

*Primary Examiner* — Essama Omgba
(74) *Attorney, Agent, or Firm* — Anova Law Group, PLLC

(57) ABSTRACT

A device for holding disk-shaped articles and a method thereof are provided. The device comprises a rotatable chuck body and at least two groups of clamping elements arranged at the edge of the chuck body. Each of the clamping elements is mounted to a pivot with the chuck body respectively by means of the rotation of the clamping element with respect to the chuck body. A radial compression spring is connected between the bottom of the clamping element and the chuck body to provide a clamping force for the clamping element. The clamping elements in the same group are provided with magnets with the same polarity, while the clamping elements in different groups are provided with magnets with the opposite polarity. Two sets of electromagnets are arranged on the chuck body and spaced apart evenly.

5 Claims, 3 Drawing Sheets

(56) References Cited

U.S. PATENT DOCUMENTS

| | | | |
|---|---|---|---|
| 5,989,342 A * | 11/1999 | Ikeda et al. | 118/52 |
| 6,095,582 A * | 8/2000 | Siniaguine et al. | 294/64.3 |
| 6,168,697 B1 * | 1/2001 | Siniaguine et al. | 204/298.15 |
| 6,363,623 B1 * | 4/2002 | Abraham | 34/58 |
| 6,680,253 B2 * | 1/2004 | Wirth et al. | 438/694 |
| 6,688,662 B2 * | 2/2004 | Casarotti et al. | 294/64.3 |
| 6,761,362 B2 * | 7/2004 | Noguchi | 279/106 |
| 8,387,635 B2 * | 3/2013 | Collins et al. | 134/153 |
| 8,435,380 B2 * | 5/2013 | Kim et al. | 156/345.55 |
| 8,646,767 B2 * | 2/2014 | Kumnig et al. | 269/225 |
| 8,801,865 B2 * | 8/2014 | Frank et al. | 134/26 |
| 2002/0153676 A1 * | 10/2002 | Noguchi | 279/106 |

\* cited by examiner

DEVICE FOR HOLDING DISK-SHAPED ARTICLES AND METHOD THEREOF

CROSS-REFERENCE TO RELATED APPLICATION

This application claims the priority benefit of China application serial no. 201210042925.3, filed Feb. 23, 2012. All disclosure of the China application is incorporated herein by reference.

FIELD OF THE INVENTION

The present invention relates to a device and method for holding planar disk-shaped articles, and particularly to a device for holding thin-walled disk-shaped articles and method thereof

BACKGROUND OF THE INVENTION

The pin chuck, Bernoulli chuck, or the like are most widely used in the field of the applications of the chucks for thin-walled disk-shaped articles. The thin-walled disk-shaped article mentioned above can be various disk-shaped articles such as a semiconductor wafer, an optical disc, or a flat panel display. The Chinese Patent CN200910087488.5 discloses a device for holding a plate-like article. The device utilizes a centrifugal force to clamp the plate-like article and a repulsive force between magnets to release the article. In the U.S. Pat. Nos. 5,513,668 and 4,903,717, a support for holding a disk-shaped article by using the Bernoulli principle is disclosed. A gas cushion is formed between the support and the disk-shaped article to hold the disk-shaped article according to the Bernoulli principle. Clamping elements arranged around the disk-shaped article are used for radial positioning. However, all of these patents suffer from the defect, that the contact portion between the clamping elements and the disk-shaped article cannot be cleaned, which may affect the overall cleaning quality of the thin-walled disk-shaped article.

SUMMARY OF THE INVENTION

Accordingly, at least one objective of the present invention is to provide a device and method for holding thin-walled disk-shaped articles, which enables to clean the contact portion between the clamping elements and the thin-walled disk-shaped article, so as to improve the overall cleaning quality of the thin-walled disk-shaped article.

To achieve these and other advantages and in accordance with the objective of the invention, as embodied and broadly described herein, the invention provides a device for holding disk-shaped articles, comprising a rotating shaft and a chuck body driven by the rotating shaft; wherein, the edge of the chuck body is provided with at least two groups of clamping elements, each group of clamping elements comprises at least three clamping elements for clamping the disk-shaped article, each of the clamping elements is mounted to a pivot with the chuck body respectively by means of the rotation of the clamping element with respect to the chuck body; a radial compression spring is connected between the bottom of the clamping element and the chuck body to provide a clamping force for the clamping element; a driving element is arranged between the clamping element and the chuck body for pushing or drawing the clamping element to rotate; during cleaning, the clamping elements in the same group are consistent in action, while the clamping elements in different groups release and clamp alternately.

According to the concept of the present invention, the driving element is an air cylinder or an electromagnet, and the clamping element is provided with a corresponding ferromagnetic material if the driving element is an electromagnet.

According to the concept of the present invention, two groups of clamping elements are provided, and each of the clamping elements is provided with the ferromagnetic material; the clamping elements in the same group have the same magnet polarity, while the clamping elements in different groups have the opposite magnet polarity; the inner circumference of the chuck body is provided with a plurality of electromagnets and the number of the electromagnets is equal to or greater than the number of the clamping elements; both the polarity and the energization time of the electromagnets are controlled.

According to the concept of the present invention, the clamping elements in different groups are evenly spaced apart.

According to the concept of the present invention, three clamping elements are provided in each group, and eighteen electromagnets are provided; wherein the electromagnets are divided in two sets of nine electromagnets evenly spaced apart, the electromagnets in the same set are fed with currents in the same direction.

According to the concept of the present invention, stopper members are arranged on the chuck body at positions corresponding to the clamping elements to limit the rotation of the clamping element with respect to the chuck body.

According to the concept of the present invention, groove structures are arranged on the top of the clamping elements for clamping the disk-shaped article.

To achieve the above object, the present invention further provides a method for holding disk-shaped articles, comprises the steps of: holding the disk-shaped article on a chuck body by at least two groups of clamping elements; wherein, each group of clamping elements comprises at least three clamping elements; performing alternate releasing and clamping of the clamping elements in different groups to clean the clamped portion of the disk-shaped article during cleaning.

According to the concept of the present invention, each of the clamping elements has a ferromagnetic property and the chuck body is provided with a plurality of electromagnets; the releasing and clamping of the clamping element are controlled by changing the polarity of the electromagnets.

According to the concept of the present invention, the method further comprises the step of performing the releasing of all the clamping elements by the repulsion force between the electromagnets and the clamping elements with the same polarity after cleaning the disk-shaped article; and removing the disk-shaped article from the chuck body by a mechanical hand.

In the present invention, the disk-shaped article is clamped by using the reaction force of the spring force and the centrifugal force acting on the clamping elements during the rotation, so as to realize the high speed rotation of the disk-shaped article along with the chuck body. The present invention further provides a method for holding disk-shaped articles, which can thoroughly clean the contact portion between the disk-shaped article and the clamping elements by releasing and clamping the clamping elements alternately.

DETAILED DESCRIPTION OF THE EMBODIMENTS

The specific implementations of the present invention will be described hereinafter in detail by referring to the accompanying drawings and embodiments. The following embodiments intend to illustrate the present invention, instead of limiting the scope of the present invention.

Figure 1:
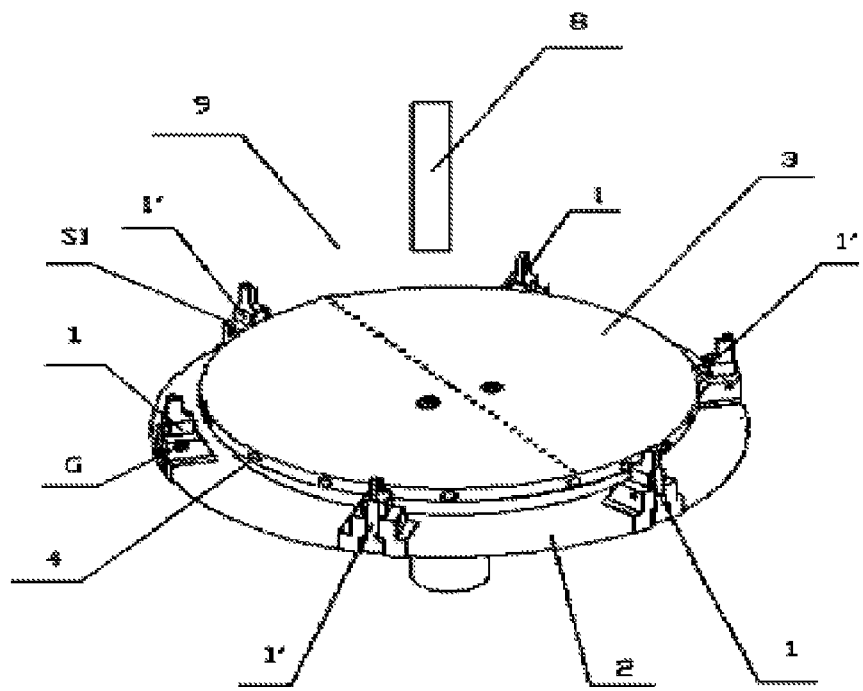
FIG. 1 is a structural view of the device for holding disk-shaped articles according to an embodiment of the present invention.
Figure 2:
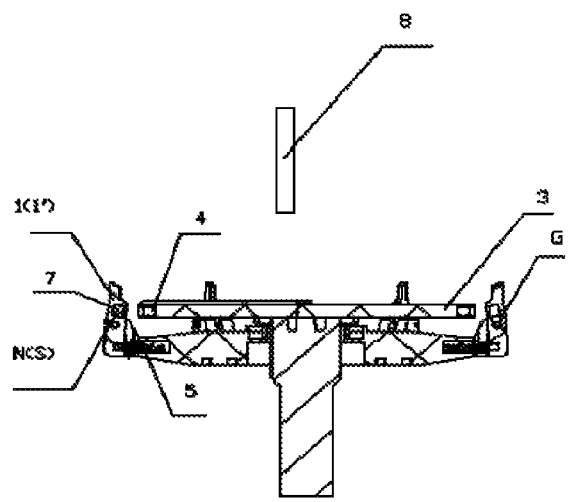
FIG. 2 is a radial cross-sectional view of the device for holding disk-shaped articles according to an embodiment of the present invention.

As shown in FIG. 1, the present embodiment provides a device for holding a disk-shaped article 9, which comprises a rotating shaft and a rotatable chuck body 3 driven by the rotating shaft. The chuck body 3 preferably is circular disk-shaped. The edge of the chuck body 3 is provided with at least two groups of clamping elements. Each group of clamping elements comprises at least three clamping elements for clamping the disk-shaped article. Each of the clamping elements is mounted to a pivot G with the chuck body respectively by means of the rotation of the clamping element with respect to the chuck body 3. A radial compression spring 5 is connected between the bottom of the clamping element and the chuck body 3 to provide a clamping force for the clamping element. The compression spring 5 can ensure the clamping element clamping the disk-shaped article tightly by the reaction force of the compressive spring 5 when the chuck body 3 is rotated at a low speed and the centrifugal force is not enough. Therefore, the relative rotation between the disk-shaped article and the chuck body 3 which may cause scratches on the back surface of the disk-shaped article can be avoided. A driving element 4 is provided between the clamping element and the chuck body 3 for pushing or drawing the clamping elements to rotate. During the cleaning of the disk-shaped article, the clamping elements in the same group are consistent in action, while the clamping elements in different groups release and clamp alternately. The clamping elements in different groups are evenly spaced apart.

The device for holding a disk-shaped article 9 can find extensive applications. The disk-shaped article can be a wafer, an optical disc, a flat panel display, or the like, and the device for holding a disk-shaped article 9 can be applied during the whole production process of these disk-shaped articles.

The driving element 4 can be an air cylinder or an electromagnet. When the driving element 4 is an electromagnet, the clamping element is provided with a corresponding ferromagnetic material. In the embodiment, the driving element 4 is preferably an electromagnet. In particular, the clamping elements are divided into two groups, and each of the clamping elements is provided with a magnet 7 as the ferromagnetic material. The clamping elements in the same group have the same magnet polarity, while the clamping elements in different groups have the opposite magnet polarity. The inner circumference of the chuck body 3 is provided with a plurality of electromagnets 4. The number of the electromagnets 4 is equal to or greater than that of the clamping elements, and both the polarity and the energization time of the electromagnet can be controlled.

Stopper members are arranged on the chuck body 3 at positions corresponding to the clamping elements, so as to limit the rotation of the clamping elements with respect to the chuck body 3. It is ensured that the disk-shaped article is clamped by the same clamping force each time, thus to avoid the loose clamping of the disk-shaped article due to a small clamping force, or the damage to the disk-shaped article due to an excessive clamping force.

Groove structures are arranged on the top of the clamping elements for clamping the disk-shaped article.

The process for holding disk-shaped articles by using the device for holding disk-shaped articles of the present invention will be described as follows:

As shown in FIG. 1, the clamping elements are divided into two groups on the chuck body 3. Each group of clamping elements comprises three clamping elements. Each clamping element 1 in the first group is embedded with a magnet 7, whose N-pole points outward, and each clamping element 1' in the second group is embedded with a magnet 7, whose S-pole points outward. The clamping element can rotate about its pivot G.

First, in the process, the electromagnet is not energized, and the chuck body 3 drives the disk-shaped article to rotate.

Then, a chemical solution is sprayed from a chemical solution spraying unit 8 to the upper surface of the disk-shaped article. Due to the rotation of the disk-shaped article, the chemical solution may uniformly cover the upper surface of the disk-shaped article. At the same time, the lower surface of the disk-shaped article is cleaned by a solution sprayed from a device such as the device for cleaning the ground unit of the disk-shaped article 2 as illustrated in FIG. 1. Since the surface tension formed in the contact portion between the clamping elements and the disk-shaped article may lead to a resistance of removing the chemical solution completely, during drying, the water component in the chemical solution may evaporate and leave a contaminated defect usually called "water stain" caused by colloid particulate contamination in the chemical solution which is used to etch and clean the surface of the disk-shaped article at the contact portion between the clamping elements and the disk-shaped article. The water stain may induce haze in the subsequent process such as the molecular epitaxy process, which is not acceptable for the process.

During the cleaning of the disk-shaped article, the method of holding disk-shaped articles comprises two stages. In the first stage, the chuck body 3 rotates at a certain speed. The electromagnets 4' and 4" are energized with the N-poles pointed inward, which produces a repulsive force on the magnet 7 embedded in the clamping element 1 in the first group and an attractive force on the magnet 7 embedded in the clamping elements 1' in the second group, thus the first group of clamping elements 1 release. Specifically, the clamping elements 1 in the first group rotate counterclockwise around the pivot G by a certain degree, so that the face S1 of the clamping element can contact the face S2 of the chuck body, and the first group of clamping elements 1 completely release. At this time, the chemical solution remaining in the contact portion between the disk-shaped article and the clamping elements in the first group can be quickly dried under the centrifugal force. However, the second group of clamping elements 1' do not release since the polarity of the magnets embedded therein is opposite to that of the magnets embedded in the first group of clamping elements.

In the second stage, the chuck body 3 still rotates at a certain speed. The electromagnets 4' and 4" are energized in the reverse direction, so that the S-poles of the electromagnet 4' and 4" are pointed inward, which produces a repulsive force on the magnet 7 embedded in the clamping elements 1' in the second group and an attractive force on the magnet embedded in the clamping elements 1 in the first group, thus the second group of clamping elements release. To be specific, the clamping elements in the second group rotate counterclockwise around the pivot G by a certain degree, so that the face S1 of the clamping member can contact the face S2 of the chuck body, and the second group of clamping elements can completely release. In this way, the chemical solution remaining in the contact portion between the disk-shaped article and the clamping elements in the second group can be quickly dried under the centrifugal force. However, the first group of clamping elements do not release, since the polarity of the magnets embedded therein is opposite to that of the magnets embedded in the second group of clamping elements.

In order to enable the clamping elements to release alternately and completely during the high speed rotation of the disk-shaped article, eighteen electromagnets are arranged inside along the circumference of the chuck body uniformly. The eighteen electromagnets are divided into two sets of nine electromagnets which are spaced apart. Therefore, the alternate release of the clamping elements to clean the clamped portion during the cleaning process can be realized by adjusting the energization time of the electromagnets even when the disk-shaped article rotates at different speeds. When the disk-shaped article rotates at a low speed, these two sets of electromagnets are energized in the same polarity, and the polarity of the two sets of electromagnets may be changed at a relative long time interval. As the rotation speed increases, only one set of electromagnets may be energized, while it may be not necessary to energize the other set. At this time, the energizing order of these two sets of electromagnets is changed at an interval of 2-3 seconds to ensure the two groups of clamping elements release alternately and successfully, thus to clean the clamped portions of the disk-shaped article.

During the rotation in the first stage, the disk-shaped article does not contact the first group of clamping elements 1 and the chemical solution remaining in the contact portion between the first group of clamping element 1 and the disk-shaped article can be removed under the centrifugal force. During the rotation in the second stage, the disk-shaped article does not contact the second group of clamping elements 1' and the chemical solution remaining in the contact portion between the second group of clamping element 1' and the disk-shaped article can be removed under the centrifugal force. In this way, the chemical solution remaining in the contact portion between the disk-shaped article and the clamping elements can be completely dried and the surface of the disk-shaped article can be thoroughly cleaned, which improves the cleaning quality.

Figure 3:
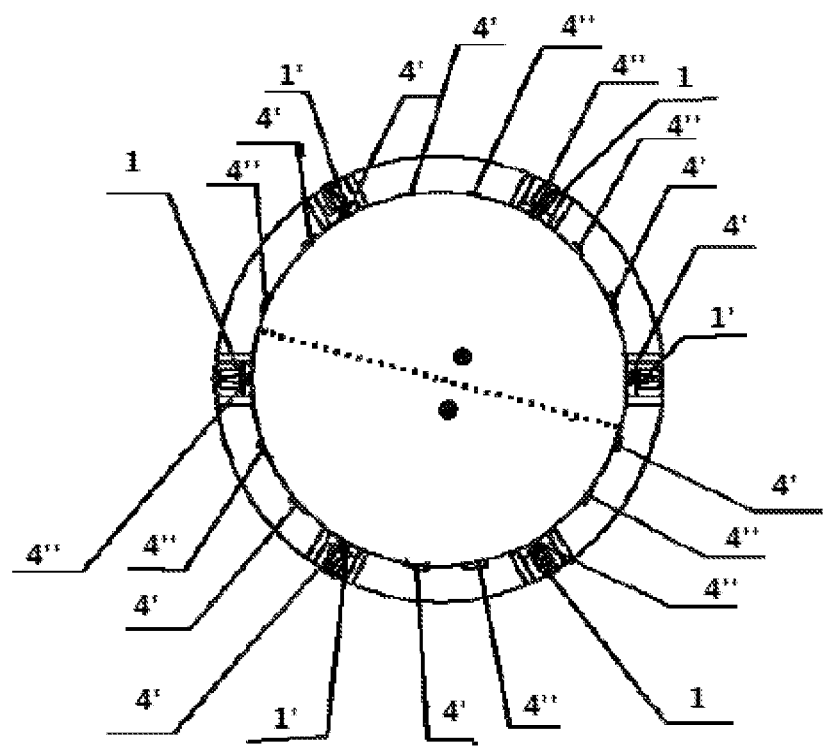
FIG. 3 is a top view of the chuck body according to an embodiment of the present invention.
Figure 4:
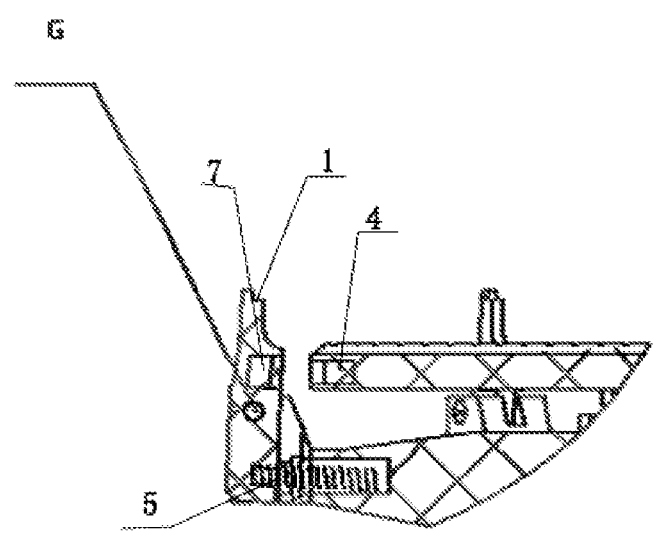
FIG. 4 is a partially structural view of the chuck body in a clamped state according to an embodiment of the present invention.
Figure 5:
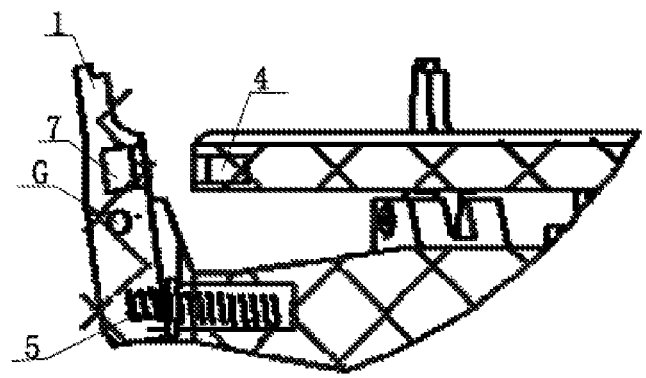
FIG. 5 is a partially structural view of the chuck body in a released state according to an embodiment of the present invention.
Figure 6:
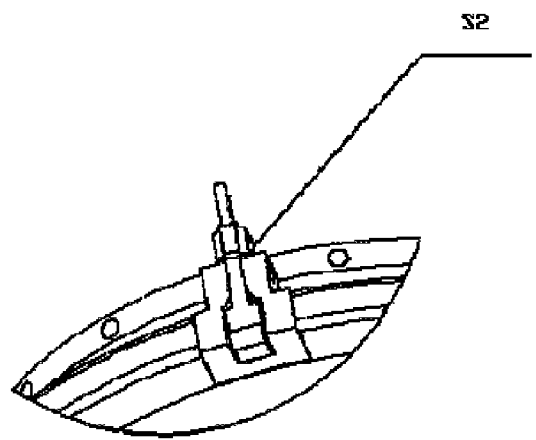
FIG. 6 is a partially structural view of the chuck body.

After completing the above process, the device for holding the disk-shaped article 9 stops at a position where the clamping elements confront the electromagnets 4, as shown in FIG. 3. The electromagnets 4' confronting the clamping elements 1' are energized with the S-poles pointed inward; the electromagnets 4" confronting the clamping elements 1 are energized with the N-poles pointed inward. As a result, the electromagnets 4' and 4" produce a repulsive force respectively on the magnets embedded in the two groups of clamping elements to make the clamping elements rotate outward around the pivot G and release. Then the disk-shaped article can be picked and replaced by a mechanical hand.

In an embodiment of the present invention, it is further provided a method for holding disk-shaped articles, wherein the disk-shaped article is placed on a chuck body and clamped by at least two groups of clamping elements. Each of the clamping elements has a ferromagnetic material and the chuck body is provided with a plurality of electromagnets. During the cleaning of the disk-shaped article, the clamping elements for holding the disk-shaped article release and clamp alternately, so as to clean the clamped portion of the disk-shaped article. The clamping actions of the clamping element are controlled by changing the polarity of the electromagnets arranged on the chuck body. After completing the cleaning of the disk-shaped article, the clamping elements are released by the repulsion force between the electromagnets and the clamping elements with the same polarity. Then, the disk-shaped article is removed from the chuck body by a mechanical hand, and another disk-shaped article is placed on the chuck body.

As can be seen from the above embodiments, the present invention provides a device for holding disk-shaped articles and a method thereof The device comprises a rotatable chuck body 3 and at least two groups of clamping elements arranged at the edge of the chuck body. Each of the clamping elements for clamping the disk-shaped article is mounted to a pivot G with the chuck body respectively by means of the rotation of the clamping element with respect to the chuck body 3. A radial compression spring 5 is connected between the bottom of the clamping element and the chuck body. During cleaning, the clamping elements in the same group are consistent in action, while the clamping elements in different groups release and clamp alternately. The clamping elements in the same group are provided with magnets with the same polarity, while the clamping elements in different groups are provided with magnets with the opposite polarity. Two sets of electromagnets are arranged on the chuck body and spaced apart evenly. In the beginning of cleaning, the two sets of electromagnets may be not energized, and the two groups of clamping elements stay in a clamped state under the compression spring force. During cleaning, the clamping elements in different groups release alternately by the change of the current direction in the electromagnets. The present invention can clean the contact portion between the clamping elements and the disk-shaped article, so as to improve the overall cleaning quality of the disk-shaped article.

In the present invention, the disk-shaped article is clamped under the reaction force of the spring force and the centrifugal force acting on the clamping element during the rotation, so as to realize the high speed rotation of the disk-shaped article along with the chuck. The present invention further provides a method for holding a disk-shaped article, wherein during the rotation, releasing and clamping the clamping elements for holding the disk-shaped article alternately to clean the contact portion between the disk-shaped article and the clamping elements completely.

The specific embodiments of the present invention have been described as above, but the present invention is not limited to the embodiments described above, since these embodiments are only exemplary in nature. All equivalent modifications and substitutions without departing from the spirit and scope of the present invention should be covered by the present invention.

The invention claimed is:

1. A method for holding a disk-shaped article by a device, the device comprises a rotating shaft, and a chuck body driven by the rotating shaft for supporting the disk-shaped article, wherein a first group of clamping elements and a second group of clamping elements are mounted on the edge of the chuck body, each group of clamping elements comprise at least 3 clamping elements each with a ferromagnetic material and able to rotate around a mounting point with respect to the chuck body; the clamping elements in the first group have a first magnet polarity, while the clamping elements in the second group have a second magnet polarity opposite to the first magnet polarity; the inner circumference of the chuck body is provided with two sets of electromagnets having controllable polarity and energization time; the method comprising the step of:

in the beginning of cleaning the disk-shaped article, de-energizing the two sets of electromagnets, rotating the chuck body;

during cleaning of the disk-shaped article, making the first group of the clamping elements and the second group of the clamping elements clamp alternately by changing the current direction in the electromagnets to clean the clamped portion of the disk-shaped article; wherein when the disk-shaped article is rotated at a low speed, the two sets of electromagnets are energized in the same polarity; when the disk-shaped article is rotated at a high speed, one set of electromagnets is energized to enable the clamping elements in the clamping state to be completely release, while the other set of electromagnets is de-energized;

after cleaning the disk-shaped article, releasing all the clamping elements by generating a repulsion force between the electromagnets and the clamping elements.

2. The method according to claim 1, wherein the releasing and clamping of the clamping elements is controlled by changing the polarity of the electromagnets.

3. The method according to claim 2, wherein further comprising the step of removing the disk-shaped article from the chuck body by a mechanical hand.

4. The method according to claim 1, wherein when the disk-shaped article is rotated at a high speed during cleaning of the disk-shaped article, the energizing order is changed at an interval of 2~3 seconds.

5. The method according to claim 1, wherein a radial compression spring is connected between the bottom of each clamping element and the chuck body;

wherein, in the beginning of cleaning the disk-shaped article, the disk-shaped article is clamped by a reaction force of elasticity of the radial compression spring and a centrifugal force acting on the clamping elements during the rotation.

\* \* \* \* \*